United States Patent [19]

Aeba

[11] Patent Number: 5,466,956
[45] Date of Patent: Nov. 14, 1995

[54] SEMICONDUCTOR INTEGRATED CIRCUIT DEVICE WITH ELECTRODE FOR MEASURING INTERLAYER INSULATOR CAPACITANCE

[75] Inventor: Nobuaki Aeba, Tokyo, Japan

[73] Assignee: NEC Corporation, Japan

[21] Appl. No.: 341,492

[22] Filed: Nov. 17, 1994

[30] Foreign Application Priority Data

Nov. 18, 1993 [JP] Japan ............................ 5-288924

[51] Int. Cl.6 .......................... H01L 27/02; H01L 27/10
[52] U.S. Cl. .................. 257/203; 257/211; 257/758; 257/48
[58] Field of Search ............................. 257/202, 203, 257/211, 532, 535, 758, 765, 774, 48; 324/519, 765, 769

[56] References Cited

FOREIGN PATENT DOCUMENTS

| | | | |
|---|---|---|---|
| 58-182237 | 10/1983 | Japan | 257/48 |
| 63-204622 | 8/1988 | Japan | 257/203 |
| 1-185941 | 7/1989 | Japan | 257/202 |
| 2-37764 | 2/1990 | Japan | 257/203 |
| 2-296348 | 12/1990 | Japan | 257/203 |
| 6-45566 | 2/1994 | Japan | 257/203 |

*Primary Examiner*—William Mintel
*Assistant Examiner*—Minhloan Tran
*Attorney, Agent, or Firm*—Laff, Whitesel, Conte & Saret, Ltd.

[57] ABSTRACT

A semiconductor integrated circuit device that enables measurement of the capacitance of an insulator film without integration scale reduction in internal circuits. The device has an internal circuit area and an I/O area on a semiconductor substrate. A first bonding pad area redundant for the device and a second bonding pad area used for an I/O terminal are formed in the I/O area. A wiring conductor is formed on the I/O area to extend from the first bonding pad area to the internal circuit area through the second bonding pad area. An interlayer insulator film is formed on the I/O area to cover the wiring conductor. A bonding pad is formed on the interlayer insulator film as the I/O terminal. The bonding pad is provided on the second bonding pad area to be connected to the wiring conductor. An electrode is provided on the first bonding pad area to be opposite to the wiring conductor through the interlayer insulator film, and is isolated from the wiring conductor. A capacitance of the interlayer insulator film is measured by using the electrode and the bonding pad.

4 Claims, 2 Drawing Sheets

SEMICONDUCTOR INTEGRATED CIRCUIT DEVICE WITH ELECTRODE FOR MEASURING INTERLAYER INSULATOR CAPACITANCE

BACKGROUND OF THE INVENTION

1. Field of the Invention

The present invention relates to a semiconductor integrated circuit device and more particularly, to a semiconductor integrated circuit device with an electrode for measuring the capacitance of an interlayer insulator film.

2. Description of the Prior Art

Recently, with conventional semiconductor integrated circuit devices such as one customized using a gate array and one designed by the standard cell method, the integration scale of electronic elements has been increasing and at the same time, density of wirings or interconnections has becoming higher. As a result, the capacitance between wiring or conductor layers has been largely affecting the transmission delay of a signal transmitted through the conductor layers, which requires precision management or control of the thickness and quality of an interlayer insulator film disposed between the conductor layers.

An example of the conventional semiconductor integrated circuit devices of this type is shown in part in FIG. 1, which is disclosed in the Japanese Patent Publication No. 2-296348 (December, 1990).

A semiconductor wafer W has repeated chips thereon, each of which contains an effective area 18 where specified integrated circuits are provided and scribe areas 19 for defining or isolating the effective area 18.

At the periphery of the effective area 18 of the chip, a field oxide film 22 is selectively formed on the substrate to form active regions therein, and a polysilicon film is selectively formed on the field oxide film 22 to produce wiring conductors 13a and 13b with approximately square shapes on the field oxide film 22. The wiring conductor 13a is extending in part to the corresponding scribe area 19 to form an electrode 23a for capacitance measurement. The wiring conductors 13a and 13b are covered with a first interlayer insulator film (not shown) in the effective area 18.

On the first interlayer insulator film, a metal film is selectively formed to produce wiring conductors 15a and 15b with approximately square shapes, which are smaller in size than the wiring conductors 13a and 13b. The wiring conductors 15a and 15b are extending in part to the corresponding scribe area 19 to form electrodes 23b and 23c for capacitance measurement, respectively. The wiring conductors 15a and 15b are covered with a second interlayer insulator film (not shown) in the effective area 18.

On the second interlayer insulator film, a metal film is selectively formed to produce bonding pads 17a and 17b with approximately square shapes, which are smaller in size than the wiring conductors 15a and 15b and are electrically connected to internal circuits (not shown) provided in the effective area 18. The bonding pads 17a and 17b are electrically connected to the wiring conductors 15a and 15b through contact holes provided in the second interlayer insulator film (not shown), respectively.

When probe needles of a capacitance measurement system are contacted with the electrodes 23a and 23b, respectively, the capacitance of the first interlayer insulator film can be measured. Similarly, when the probe needle is contacted with the electrode 23c and the bonding pad 17b, the capacitance of the second interlayer insulator film can be measured.

The measurement results thus obtained are utilized for precision managing or controlling the thickness and quality of the first or second interlayer insulator films.

Another example of the conventional semiconductor integrated circuit devices of this type is shown in part in FIG. 2.

As shown in FIG. 2, a first insulator film 33a is formed on a semiconductor substrate 21 and a first wiring layer 31 made of polysilicon is formed on the first insulator film 33a. The first wiring layer 31 is covered with a second insulator film 33b.

A second wiring layer 32 made of polysilicon and a conductor layer 35 are formed on the second insulator film 33b. The second wiring layer 32 and the conductor layer 35 are covered with a third insulator film 33c.

Third and fourth wiring layers 34 and 37 made of metal are formed on the third insulator film 33c. The third wiring layer 34 is contacted with the first polysilicon wiring layer 31 through contact holes provided in the second and third insulator films 33b and 33c. The fourth wiring layer 37 is contacted with the second polysilicon wiring layer 32 through a contact hole provided in the third insulator film 33c. The third and fourth wiring layers 34 and 37 are covered with a fourth insulator film 33d.

When probe needles of a capacitance measurement system are contacted with the third and fourth wiring layers 34 and 37, respectively while changing the voltage applied to the third conductor layer 34 and keeping the electric potential of the conductor layer 35 constant, the capacitance $C_X$ of the second insulator film 33b can be measured with reduction in stray capacitance $C_S$ between the first and fourth wiring layers 31 and 37.

The measurement result is utilized for precise managing or controlling the thickness and quality of the second insulator film 33b, similar to the example in FIG. 1.

With the conventional semiconductor integrated circuit device shown in FIG. 1, the electrodes 23a, 23b and 23c for capacitance measurement are formed in the scribe area 19, i.e., outside of the internal circuit area 18, and the bonding pad 17b is used for measuring the capacitance of the second interlayer insulator film. As a result, there is an advantage that integration scale of the internal circuits is not reduced.

However, all of the electrodes 23a, 23b and 23c need to be extended from the effective area 18 to the scribe area 19 beyond a high step of 1 μm or more in height. Accordingly, there arises a problem of difficulty in formation of the electrodes 23a, 23b and 23c and ease in breaking of the conductor 13a and/or the conductors 15a and 15b.

Also, with the conventional semiconductor integrated circuit device shown in FIG. 2, the second polysilicon wiring layer 32 for capacitance measurement is formed in the internal circuit area. As a result, there is a disadvantage of integration scale reduction of the internal circuits.

SUMMARY OF THE INVENTION

Accordingly, an object of the present invention is to provide a semiconductor integrated circuit device that enables measurement of the capacitance of an insulator film without integration scale reduction of internal circuits.

Another object of the present invention is to provide a semiconductor integrated circuit device that causes no difficulty in fabrication and no easy breaking as those in the conventional one shown in FIG. 1.

A semiconductor integrated circuit device according to the present invention has an internal circuit area for internal circuits and an I/O area for I/O terminals, both of which are provided on a semiconductor substrate.

A first bonding pad area redundant for the device is formed in the I/O area. A second bonding pad area that are adjacent to the first bonding pad area and are used for one of the I/O terminals is formed in the I/O area.

A wiring conductor is formed on the I/O area to be electrically connected to the internal circuits. The wiring conductor is extended from the first bonding pad area to the internal circuit area through the second bonding pad area. An interlayer insulator film is formed on the I/O area to cover the wiring conductor.

A bonding pad is formed on the interlayer insulator film as one of the I/O terminals. The bonding pad is provided on the second bonding pad area to be electrically connected to the wiring conductor.

An electrode for capacitance measurement is provided on the first bonding pad area to be opposite to the wiring conductor through the interlayer insulator film. The electrode is isolated from the wiring conductor.

A capacitance of the interlayer insulator film is measured by using the electrode and the bonding pad.

With the semiconductor integrated circuit device of the present invention, the electrode formed on the first bonding pad area and the bonding pad formed on the second bonding pad area act as a pair of conductors of a capacitor and the interlayer insulator film acts as a dielectric of the capacitor. Therefore, the capacitance of the interlayer insulator film can be measured by using the bonding pad and the electrode.

Also, since the electrode is provided on the first bonding pad area that is redundant for this device and positioned in the I/O area, integration scale of the internal circuits is not reduced.

Further, the wiring conductor is formed on the I/O area to extend from the first bonding pad area to the internal circuit area through the second bonding pad area adjacent to the first bonding pad area. The electrode can be formed in the process step of forming the bonding pad. As a result, there arise no such the difficulty in fabrication of the wiring conductor and no such easiness in the breaking of the obtainable conductor as those in the conventional one shown in FIG. 1.

DETAILED DESCRIPTION OF THE PREFERRED EMBODIMENTS

Figure 1:
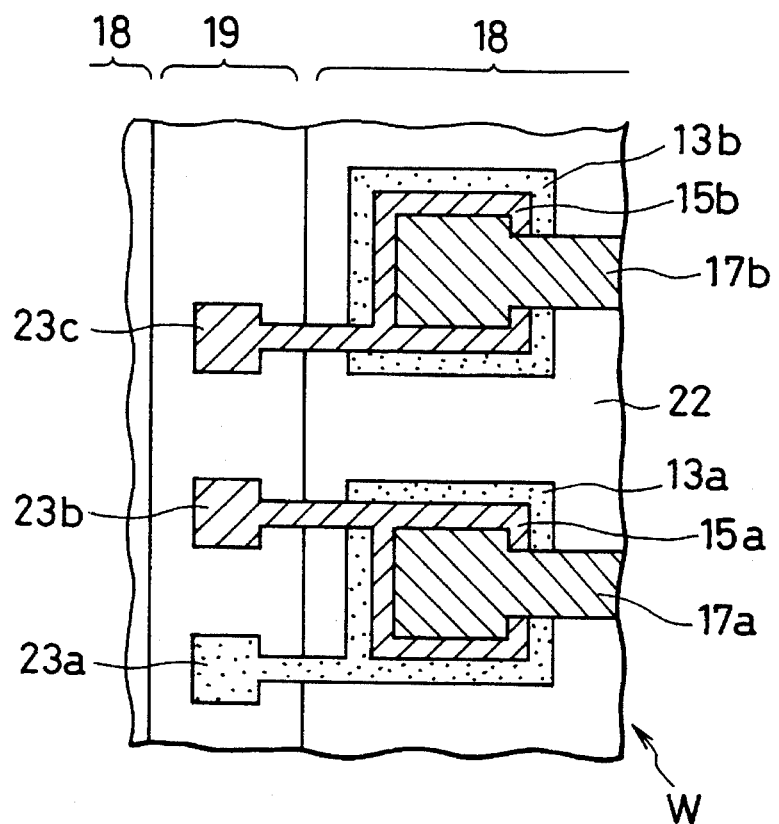
FIG. 1 is a partial plan view of a conventional semiconductor integrated circuit device.
Figure 2:
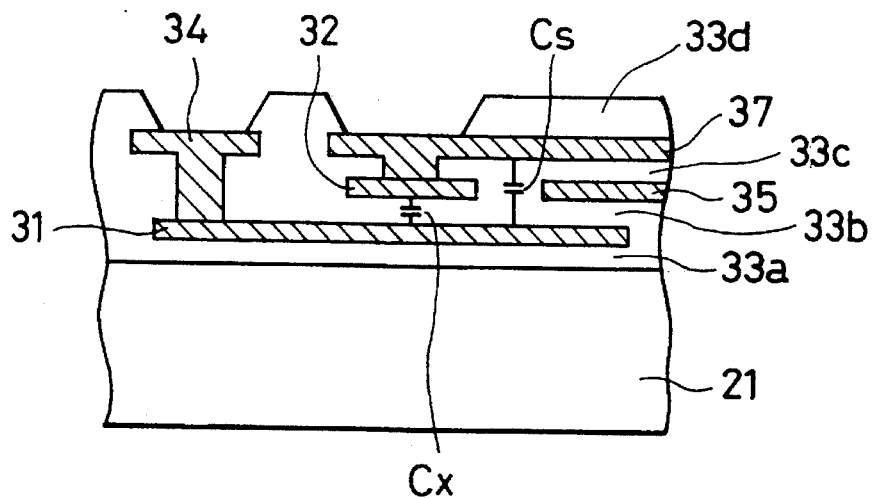
FIG. 2 is a partial plan view of another conventional semiconductor integrated circuit device.

A preferred embodiment of the present invention will be described below referring to the drawings attached.

Figure 3A:
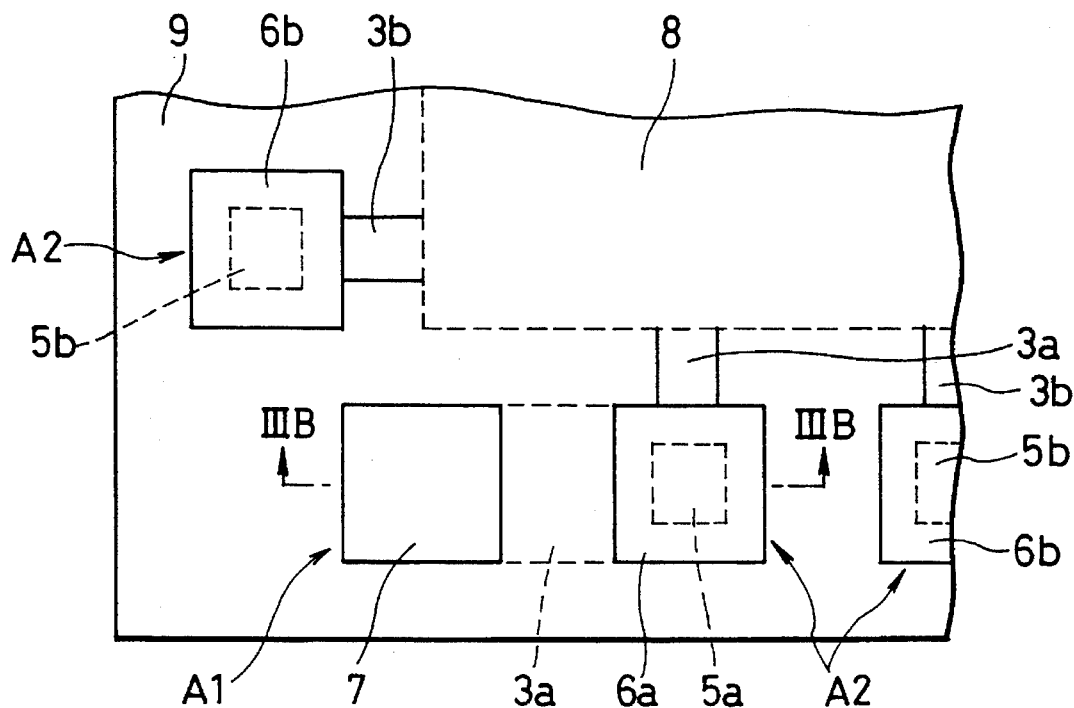
FIG. 3A is a partial plan view of a semiconductor integrated circuit device according to an embodiment of the invention.
Figure 3B:
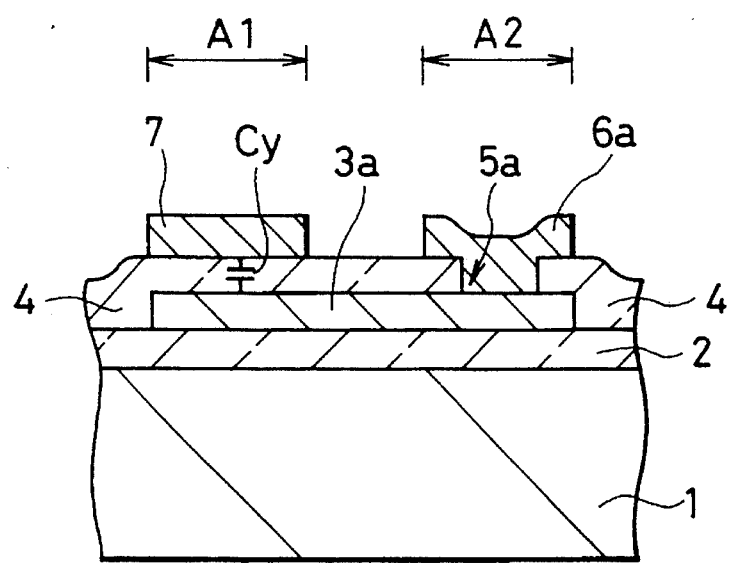
FIG. 3B is a partial cross section along the line IIIB—IIIB in FIG. 3A, respectively.

As shown in FIGS. 3A and 3B, a semiconductor integrated circuit device according to an embodiment of the invention has a semiconductor substrate or chip 1 containing an internal circuit area 8 formed at the center of the substrate 1 and an input-output (I/O) area 9 formed at the periphery of the substrate 1 to surround the internal circuit area 8.

Integrated circuits, i.e., logic elements such as gates are provided in the internal circuit area 8.

The I/O area 9 contains first and second bonding pad areas A1 and A2 thereon for the I/O terminals. The first bonding pad area A1 is not used for the I/O terminal in this device, in other words, the area A1 is redundant for this device. The second bonding pad areas A2 are used for the I/O terminals, in other words, bonding pads and wiring conductors are provided on the areas A2, respectively, as stated below.

In the I/O area 9, as clearly shown in FIG. 3B, a field oxide film 2 is selectively formed on the substrate 1 to surround entirely the internal circuit area 8. A first wiring conductor 3a and second wiring conductors 3b are formed on the field oxide film 2. The first and second wiring conductors 3a and 3b are made of metal such as aluminum and are electrically connected to the internal circuits in the internal circuit area 8, respectively.

The first wiring conductor 3a has a plan shape like a character L. The first portion of the conductor 3a that is relatively wider is extending along the nearest side of the internal circuit area 8 from the first bonding pad area A1 to adjacent one of the second bonding pad areas A2. The first portion is about 100 μm in width. The second portion of the conductor 3a that is relatively narrower is extending perpendicular to the first portion from the second bonding pad area A2 to the internal circuit area 8.

The second wiring conductors 3b are extending from the corresponding second bonding pad areas A2 to the internal circuit area 8, respectively.

An interlayer insulator film 4 with a thickness of 1 μm is formed over the substrate 1 to cover the first and second wiring conductors 3a and 3b and the uncovered field oxide film 2. The interlayer insulator film 4 is made of phosphosilicate glass (PSG) or the like and has through holes 5a and 5b.

Bonding pads 6a and 6b are formed on the interlayer insulator film 4 as the I/O terminals, respectively. These bonding pads 6a and 6b have approximately square plan shapes, respectively and the sizes of which are about 100 μm×100 μm.

The bonding pad 6a is positioned on one of the second bonding pad areas A2 to be opposite to the first wiring conductor 3a, and is electrically connected to the wiring conductor 3a through the through hole 5a. The bonding pads 6b are positioned on the second bonding pad areas A2 to be opposite to the wiring conductors 3b and are electrically connected to the wiring conductors 3b through the through hole 5b, respectively, except for the second bonding pad area A2 adjacent to the first bonding pad area A1.

An electrode 7 for capacitance measurement is formed on the interlayer insulator film 4 and is positioned on the first bonding pad area A1 to be opposite to the first wiring conductor 3a. The electrode 7 is isolated from not only the second wiring conductors 3b but also the first wiring conductor 3a. In other words, the electrode 7 is not electrically connected to the first wiring conductor 3a because no corresponding through hole is provided in the interlayer insulator film 4. The electrode 7 also has an approximately square plan shape and the size of which is about 100 μm×100 μm.

The fabrication method of the semiconductor integrated circuit device described above is as follows:

First, the semiconductor substrate or chip 1 including the internal circuit area 8 in which the internal circuits are formed and the I/O area 9 in which the first and second bonding pad areas A1 and A2 are formed is prepared.

Next, a metal film is deposited on the field oxide film 2 in the I/O area 9 and is patterned by etching to produce the first and second wiring conductors 3a and 3b.

The interlayer insulator film 4 with a thickness of 1 μm is then deposited over the substrate 1 to cover the first and second wiring conductors 3a and 3b and the uncovered field oxide film 2. The film 4 thus deposited is selectively etched to produce the through holes 5a and 5b therein at given positions.

Finally, a metal film of aluminum or the like with a thickness of 1 μm is deposited by sputtering on the interlayer insulator film 4 and is patterned to produce the bonding pads 6a and 6b and the electrode 7.

Thus, the semiconductor integrated circuit device of the embodiment is obtained.

With the device of this embodiment, since the electrode 7 is provided on the interlayer insulator film 4 to be opposite to the first wiring conductor 3a, the electrode 7 and the first wiring conductor 3a compose a pair of parallel conductor plates of a capacitor and the interlayer insulator film 4 compose a dielectric of the capacitor.

Therefore, when probe needles of a capacitance measurement system are contacted with the electrode 7 and the bonding pad 6a, respectively, the capacitance $C_Y$ of the capacitor, i.e., the capacitance of the interlayer insulator film 4 on the first bonding pad area A1 can be measured.

The measurement result thus obtained can be utilized for precision managing or controlling the thickness and quality of the interlayer film 4, which leads the device to uniformity in electronic characteristics and improvement in reliability. Also, popular probe for measuring electronic characteristics of semiconductor chips can be used for measuring the capacitance.

In addition, because the electrode 7 is provided on the first bonding pad area A1 that is redundant for this device, the integration scale can be prevented from reducing in the internal circuit area 8.

Further in addition, the first wiring conductor 3a is entirely formed on the filed oxide film 2, which means that the conductor 3a does not need to be extended beyond such a step as in the conventional one shown in FIG. 1. As a result, there is no difficulty in fabrication and no easy breaking as in the conventional one shown in FIG. 1.

In the embodiment, a semiconductor integrated circuit device customized using gate arrays is described as an example, however, the invention may be applied to any other semiconductor integrated circuit devices if they have at least one redundant bonding pad area.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor integrated circuit device comprising:

an internal circuit area provided on a semiconductor substrate, internal circuits being provided in said internal circuit area;

an I/O area provided on said substrate, I/O terminals being provided in said I/O area;

said I/O area having a first bonding pad area that is redundant for said device and second bonding pad areas used for said I/O terminals;

an insulator film formed on said substrate in said I/O area;

a first wiring conductor formed on said insulator film over said I/O area, said first wiring conductor being electrically connected to said internal circuits;

said first wiring conductor extending from said first bonding pad area to said internal circuit area through an adjacent one of said second bonding pad areas;

second wiring conductors formed on said insulator film over said I/O area, said second wiring conductors being electrically connected to said internal circuits, respectively;

said second wiring conductors extending from said respective second bonding pad areas to said internal circuit area;

an interlayer insulator film formed to cover said first wiring conductor and said second wiring conductors;

a first bonding pad formed on said interlayer insulator film as one of said I/O terminals, said first bonding pad being provided over a corresponding one of said second bonding pad areas electrically connected to said first wiring conductor;

second bonding pads formed on said interlayer insulator film as the other of said I/O terminals, said second bonding pads being provided over said second bonding pad areas, except for said second bonding pad area corresponding to said first bonding pad being electrically connected to said second conductors, respectively; and an electrode for capacitance measurement provided over said first bonding pad area opposite to said first wiring conductor through said interlayer insulator film, said electrode being isolated from said first wiring conductor and said second wiring conductors;

wherein a capacitance of said interlayer insulator film is measured by using said electrode and said first bonding pad.

2. The device as claimed in claim 1, wherein said first wiring conductor has a first portion extending along the nearest side of said internal circuit area from said first bonding pad area to said adjacent one of said second bonding pad areas and a second portion extending from said adjacent one of said second bonding pad areas toward said internal circuit area.

3. In a semiconductor integrated circuit device having an internal circuit area for internal circuits and an I/O area for I/O terminals both of which are provided on a semiconductor substrate, said device comprising:

a first bonding pad area formed in said I/O area, said first bonding pad area being redundant for said device;

a second bonding pad area formed in said I/O areas, said second bonding pad area being adjacent to said first bonding pad area and being used for one of said I/O terminals;

a wiring conductor formed on said I/O area, said wiring conductor being electrically connected to said internal circuits;

said wiring conductor being extending from said first bonding pad area to said internal circuit area through said second bonding pad area;

an interlayer insulator film formed on said I/O area to cover said wiring conductor;

a bonding pad formed on said interlayer insulator film as one of said I/O terminals, said bonding pad being provided on said second bonding pad area electrically connected to said wiring conductor; and an electrode for capacitance measurement provided on said first bonding area opposite to said wiring conductor through said interlayer insulator film, said electrode being isolated from said wiring conductor;

wherein a capacitance of said interlayer insulator film is measured by using said electrode and said bonding pad.

4. The device as claimed in claim 3, wherein said wiring conductor has a first portion extending along the nearest side of said internal circuit area from said first bonding pad area to said second bonding pad area and a second portion extending from said second bonding pad area toward said internal circuit area.

* * * * *